US007414437B1

(12) United States Patent
Blick et al.

(10) Patent No.: US 7,414,437 B1
(45) Date of Patent: Aug. 19, 2008

(54) NANOMECHANICAL COMPUTER

(75) Inventors: Robert H. Blick, Madison, WI (US); Robert A. Marsland, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/749,533

(22) Filed: May 16, 2007

(51) Int. Cl.
*H03K 19/00* (2006.01)
*H03K 19/20* (2006.01)
*H01L 23/58* (2006.01)

(52) U.S. Cl. ....................... 326/101; 326/104; 257/499; 257/798; 977/724; 977/732; 977/940

(58) Field of Classification Search ................. 326/101, 326/104; 257/499, 798; 977/724, 732, 940
See application file for complete search history.

(56) References Cited

U.S. PATENT DOCUMENTS

| | | | |
|---|---|---|---|
| 6,946,693 | B1 | 9/2005 | Scheible et al. |
| 7,214,571 | B2 | 5/2007 | Scheible et al. |

*Primary Examiner*—Evan Pert
(74) *Attorney, Agent, or Firm*—Boyle Fredrickson S.C.

(57) ABSTRACT

An electromechanical switching device employs a first nanoscale pillar shuttling charge between opposed charged electrodes. Motion of the first pillar is coupled to a second set of pillars providing controlled charge transfer between a second isolated set of electrodes. Standard logic elements may be constructed using this switching device.

12 Claims, 3 Drawing Sheets

FIG. 1
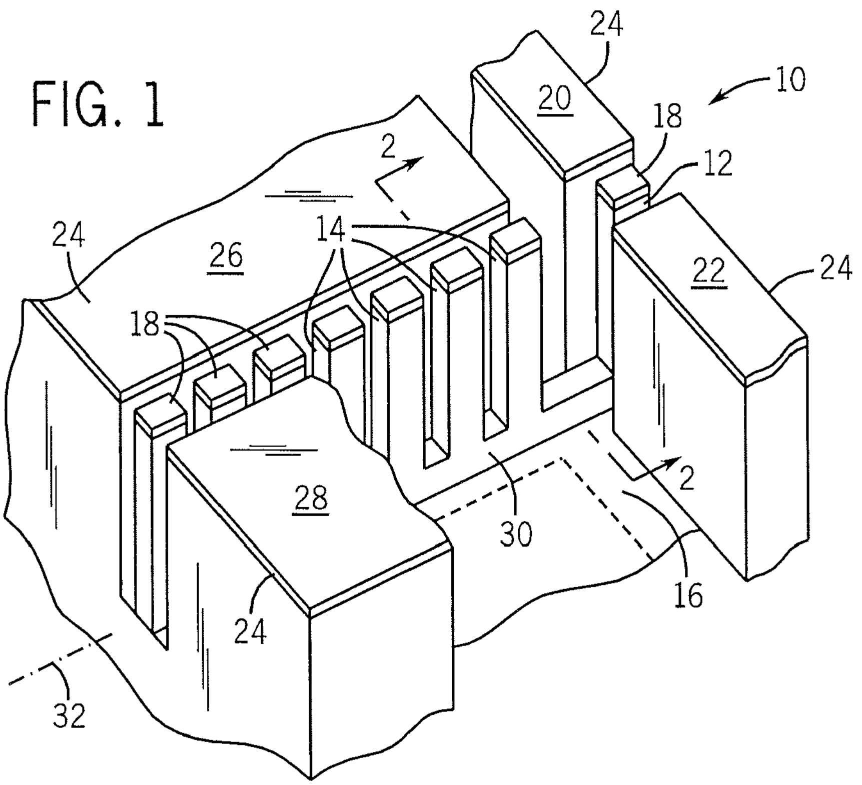
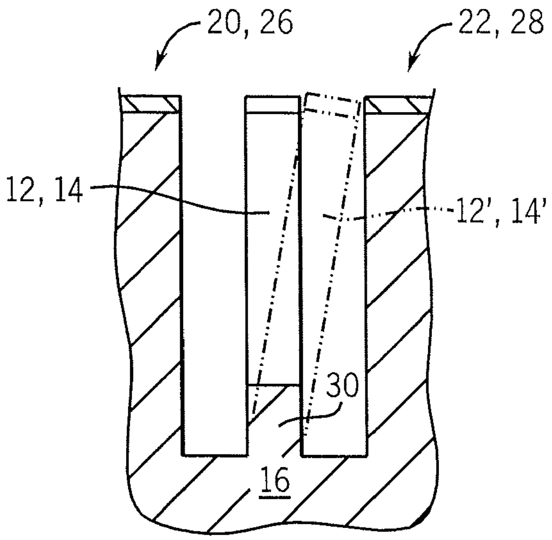
FIG. 2
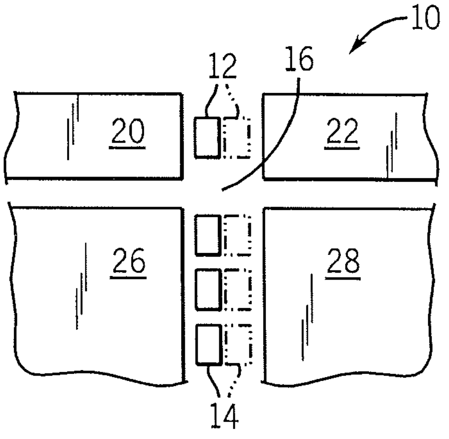
FIG. 3

NANOMECHANICAL COMPUTER

STATEMENT REGARDING FEDERALLY SPONSORED RESEARCH OR DEVELOPMENT

Not Applicable

CROSS REFERENCE TO RELATED APPLICATION

Not Applicable

BACKGROUND OF THE INVENTION

The present invention relates to nanoscale mechanical devices and in particular to a nanoscale electromechanical switching element permitting the construction of a nanoscale mechanical computer.

Conventional integrated circuits allow for the combination of large numbers of transistors into logical gates such as NAND gates or NOR gates. These gates in turn may be interconnected within the integrated circuit to create more complex logical devices such as gate arrays or computers.

Transistor integrated circuits can produce extremely complex and high-speed logical devices but they have some significant limitations. The transistors in an integrated circuit can be disrupted by radiation, a problem for circuits intended for spaceflight, for example. In space, energetic plasmas, particles, and other forms of radiation degrade conventional transistors over time and may generate charge carriers in the transistors causing unexpected transistor switching.

Conventional integrated circuits are also limited with respect to operating temperatures. This is a problem for circuits that must operate in hot environments, for example, in automotive applications. Operating temperature limitations can also constrain the design of such integrated circuits to the extent that power dissipation by the circuit itself becomes a significant source of heating.

Operation of conventional integrated circuits at extremely low voltages can also be a problem.

SUMMARY OF THE INVENTION

The present invention provides an electromechanical nanoscale switching element that may be readily constructed using standard integrated circuit techniques using materials that allow the switching element to operate at temperatures far exceeding those possible for conventional transistors. The electromechanical design is inherently radiation insensitive, and the design holds promise for extremely low power dissipation and low voltage operation.

Specifically, the present invention provides an electrical switching element having at least one first nanoscale pillar extending upward from a substrate between a first pair of opposed electrodes to flex between the first electrodes. At least one second nanoscale pillar extends upward from the substrate between a second pair of opposed electrodes. The second nanoscale pillar is coupled to the first nanoscale pillar to flex with the first nanoscale pillar alternately toward and away from the electrodes of the second pair under influence of the first nanoscale pillar. In this way, flexure of the first nanoscale pillar promotes a charge transfer between the second opposed electrodes via the second nanoscale pillar.

It is thus an object of one embodiment of the invention to provide a transistor-like control of current flow where the first pair of terminals provides a “gate” terminal and the second pair of terminals provides “drain” and “source” terminals.

Greater charge transfer may occur between the second opposed electrodes than between the first opposed electrodes for each cycle of flexure of the pillars.

It is thus an object of one embodiment of the invention to provide for gain or amplification as is necessary to allow adequate “fan-out” for the practical interconnection of logical devices.

The first pair of opposed electrodes and the second pair of opposed electrodes may have substantially identical bias voltages.

It is thus an object of one embodiment of the invention to provide logical elements that may be readily interconnected and powered by a single voltage.

The first nanoscale pillar may be coupled to the second nanoscale pillar with a web attached between the first nanoscale pillar and second nanoscale pillar to communicate the flexure of the first nanoscale pillar to the second nanoscale pillar It is thus an object of one embodiment of the invention to provide for a simple coupling mechanism between the pillar sets that preserves electrical isolation.

The web may be flexible to allow substantial motion of the first nanoscale pillar independent of the second nanoscale pillar.

It is thus an object of one embodiment of the invention to moderate the coupling between the pillar sets to provide for free resonance of the second pillar set such as may be used to provide for a mechanical amplification of motion at a natural resonance.

The first nanoscale pillar and multiple second nanoscale pillars may be arranged along a common web mechanically connecting each of the pillars and flexing therewith.

It is thus another object of one embodiment of the invention to provide for an architecture that allows the number of pillars in the second pillar set to be freely expanded.

There may be only a single first nanoscale pillar.

It is thus an object of one embodiment of the invention to minimize current flow through the first pillar set.

The first nanoscale pillar may self-excite into oscillation between the opposed first electrodes with an application of a DC voltage across the first electrodes.

It is thus an object of one embodiment of the invention to allow the construction of logical gates working with DC logic signals.

The invention may provide a logical NAND gate formed of multiple electric switching elements. A first and second input to the logical NAND gate may connect respectively to control electrodes of a first and second electric switching element having power electrodes connected in parallel between a power source and an output of the NAND gate. The first and second input to the logical NAND gate also may connect respectively to control electrodes of a third and fourth electric switching element having power electrodes connected in series between a power return and an output of the NAND gate.

It is thus an object of one embodiment of the invention to provide a fundamental building block to logic circuits using the switching element of the present invention.

The invention may produce a computer comprising a plurality of electric switching elements interconnected to provide logical gates and further including at least one memory element communicating with the logical gates to provide for the execution of a stored program using the memory element.

It is thus object of one embodiment of the invention to construct a fully electromechanical computer or similar logic circuit.

The memory element may be comprised of logical gates connected as bi-stable elements.

It is thus another object of one embodiment of the invention to employ standard gates as the memory element.

Alternatively, the memory element may be comprised of a pillar extending upward from a substrate between opposed first and second electrode units. The second electrode unit may present a bifurcated electrode face of electrically independent electrodes. The electrode faces of the first and second electrode units may be shaped to promote two distinct vibratory modes of flexure of the pillar within the electric field: a first mode of flexure transferring charge between the first electrode unit and a first electrode of the second electrode unit, and a second mode of flexure transferring charge between the first electrode unit and a second electrode of the second electrode unit. A single bit of information may be recorded in the vibratory mode.

It is thus another object of one embodiment of the invention to provide an extremely compact memory element suitable for use with the logic devices of the present invention and employing similar technology These particular features and advantages may apply to only some embodiments falling within the claims and thus do not define the scope of the invention.

BRIEF DESCRIPTION OF THE DRAWINGS

FIG. 1 is a perspective view in partial cut-away of an electromechanical transistor of the present invention using sets of upwardly extending pillars as may be constructed using conventional integrated circuit techniques;

FIG. 2 is a cross-sectional, elevational view along line 2-2 of FIG. 1 showing a single pillar of the electromechanical transistor of FIG. 1 in flexure with a corresponding flexing of an interconnecting web;

FIG. 3 is a top plan view of a portion of FIG. 1 showing a range of movement of the pillars between opposed electrodes for charge transfer;

DETAILED DESCRIPTION OF THE PREFERRED EMBODIMENT

Figure 4:
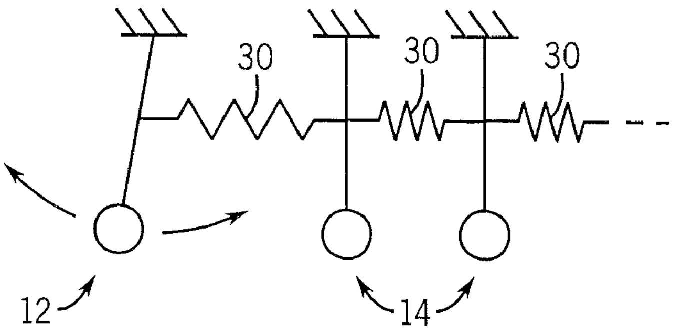
FIG. 4 is a simplified mechanical model of the pillars of FIG. 1 with a constrained coupling coefficient to allow for free resonance of the pillars.

Referring now to FIGS. 1 and 3, a nanoscale electromechanical transistor 10 of the present invention may provide a first set of upwardly extending pillars 12 (one, in this example) and a second set of upwardly extending pillars 14, each having lower ends anchored to a substrate 16 and upper ends, cantilevered and having conductive caps 18. The pillars 12 and 14 are constructed from an electrically insulating material, such as undoped silicon, and the conductive caps 18 are constructed of a conductive material such as heavily doped silicon or gold metallization.

The pillar 12 is positioned between a first and second electrode 20 and 22 formed of an upper conductive layer 24 supported on insulating material to be coplanar with the conductive caps 18. The upper end of the pillars 12 may vibrate along an axis generally parallel to the substrate 16 and extending between the electrodes 20 and 22. An application of the DC voltage across electrodes 20 and 22 will cause the vibration of the pillar 12 between those electrodes and a transfer of charge between electrodes 20 and 22 mediated by the charge carrying effect of the conductive caps 18 of the pillar 12. This effect and one possible construction of the pillar 12 and electrodes 20 and 22 is described in U.S. Pat. No. 6,946,693, issued Sep. 20, 2005 and entitled: *Electromechanical Electron Transfer Devices*, assigned to the assignee of the present invention and hereby incorporated by reference.

Referring still to FIGS. 1 and 3, the second set of pillars 14 are positioned along a line between different electrodes 26 and 28 also having upper conductive layers 24 in the same plane as the conductive caps 18 on second set of pillars 14. The configuration of the second set of pillars 14 and the electrodes 26 is selected to discourage self excitation. This may be done by affecting the shape of the electrostatic field between the electrodes 26 and 28 and by controlling the shape and size of the individual pillars of the second set of pillars 14. In an alternative embodiment both pillars 12 and 14 may be constructed to resist self excitation and the pillar 12 may be excited into resonance by the application of an AC current of the appropriate frequency.

Referring now to FIGS. 1 and 2, the first set of pillars 12 and the second set of pillars 14 may both attach to the substrate 16 through a web 30 providing a continuous and upstanding rail whose lower edge is affixed to the substrate and whose upper edge provides a common support for the first and second set of pillars 12 and 14. The cross-section of the web 30 and its attachment to the substrate 16 and the first and second set of pillars 12 and 14 is such as to cause flexure of the web 30 as pillar 12 flexes to a position indicated by pillar 12', with the flexure of the web 30 communicating this pillar flexure to the second set of pillars 14 (indicated by pillar 14') providing a mechanical coupling between the two sets of pillars 12 and 14.

Figure 5:
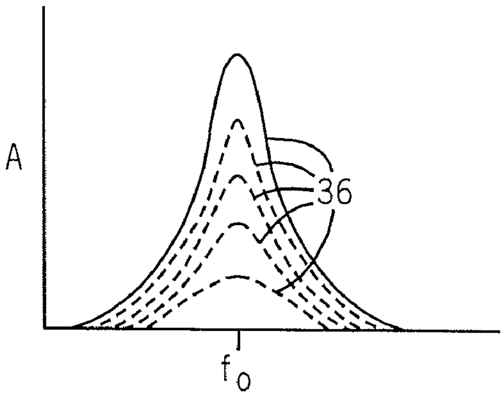
FIG. 5 is a plot of pillar vibration amplitude versus frequency over multiple cycles showing an amplifying effect provided by the resonance of FIG. 4.

Referring now to FIGS. 4 and 5, each pillar 12 presents a mechanically resonant mass represented here as a pendulum and the web 30 provides a coupling between pillars 12 and 14 represented here as coupling springs. Motion of pillar 12 communicates an excitation force via the web 30 to the next pillar 14, and that pillar 14 to the next pillar 14 and so on. The natural resonant frequency of the pillars 12 and 14 will typically be selected to be identical, or harmonically related. Such coupled resonant systems can provide a form of mechanical amplification as each cycle of the pillar 12 "pumps" additional energy into the pillars 14, so that over time the amplitude of motion A (shown in FIG. 5) for the resonant frequency of the pillar 14 rises over time possibly to an amplitude exceeding that of the pillar 12.

This amplification effect requires a coupling between the pillars 12 and 14 that provides some independence of movement of the pillars 12 and 14. In an alternative embodiment the web 30 may provide a stiffer connection between pillars 12 and 14, for example, by raising its height of attachment to the pillars 12 and 14 possibly with no, or a more flexible, attachment to the substrate 16, to provide less resonant amplification but a faster response time.

Other coupling mechanisms may also be possible, while still providing electrical isolation between the pillars 12 and 14, for example, magnetic or electrostatic coupling.

Generally multiple pillars 14 (for example 80) may be attached to a single pillar 12 by a common web 30 so that a relatively large amount of current flow between electrodes 26 and 28 may be promoted with a relatively small current flow between electrodes 20 and 22. This provides a power gain necessary for the practical construction of logic devices. A power gain possibly may be realized by providing similar current flow between electrodes 26 and 28 and between electrodes 20 and 22, while operating electrodes 26 and 28 at a greater voltage than electrodes 20 and 22 or making other similar tradeoffs between current and voltage gain.

Figure 6:
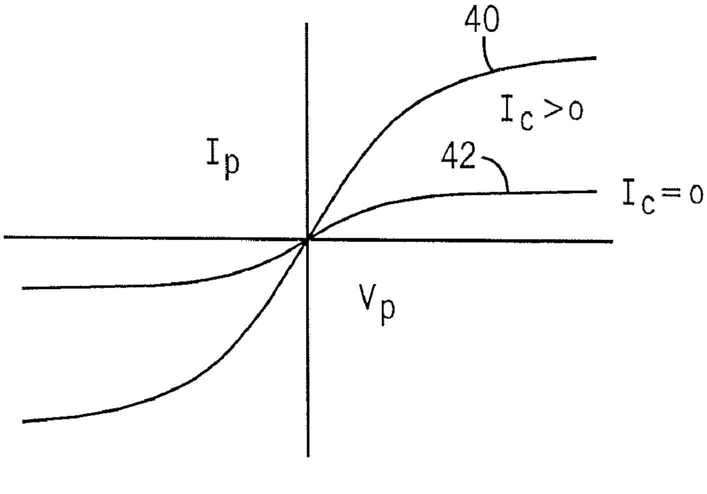
FIG. 6 is an IV diagram of the transistor of FIG. 1.

Referring now to FIG. 6, the "power" current $I_p$ flowing between electrodes 26 and 28 is dependent on a "control" current $I_c$ flowing between electrodes 20 and 22 so that $I_p$ rises quickly with increased voltage across electrodes 26 and 28 (per curve 40) when the $I_c$ is greater than zero and $I_p$ is essentially zero (per curve 42) when $I_c$ is zero. Generally the device may operate symmetrically with either direction of current flow between electrodes 26 and 28 providing some possible advantages in this regard over conventional transistors.

Generally the current $I_p$ will rise with increased voltage across electrodes 26 and 28 (per curve 40) reflecting increased charge transfer under higher voltages; however, in some modes of operation it may be possible to provide an essentially constant current flow for a range of voltages across electrodes 26 and 28 exploiting the throttling effect of transferring charge by a vibrating conductor.

Figure 7:
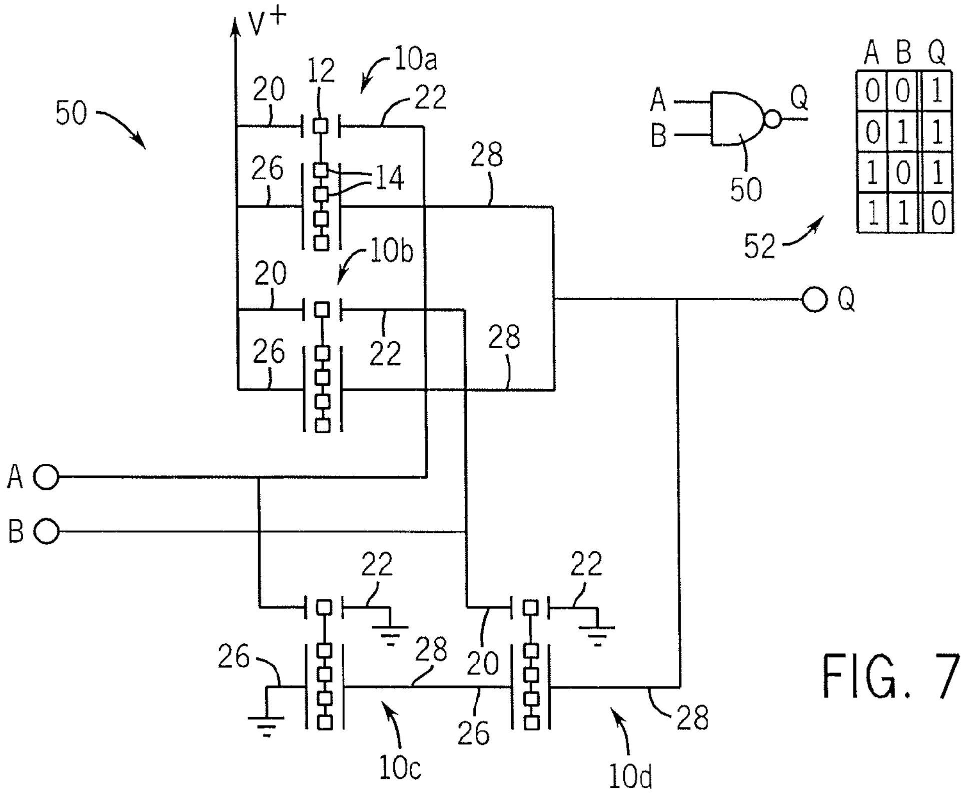
FIG. 7 is a schematic representation of a NAND gate constructed of the transistors of the present invention with an inset showing a conventional NAND gate symbol and truth table.

Referring now to FIG. 7 the electromechanical transistor 10 of the present invention may be used to manufacture a variety of different logic circuits including, for example, inverters and other logical gates. As an example, a fundamental building block of many logical elements is the NAND gate 50, having a truth table 52 providing an output Q that is logically false (indicated conventionally by a zero and a zero voltage) when both of the two inputs A and B have a logical true state (indicated conventionally by a one and an arbitrary positive voltage). Such a NAND gate 50 may be constructed by the assembly of four electromechanical transistors 10*a* through 10*d* together with metallized traces or other conventional interconnection systems on a single integrated circuit substrate.

Specifically electrodes 20 and 26 of electromechanical transistors 10*a* and 10*b* may be connected to a source of positive voltage powering the NAND gate 50. The electrodes 22 of electromechanical transistor 10*a* may be connected to the A input of the NAND gate 50, and electrode 22 of the electromechanical transistors 10*d* may be connected to the B input of the NAND gate 50. In this way, a logical false or zero voltage at either input A or B will cause the activation through self excitation of pillars 12 of one or both of electromechanical transistors 10*a* and 10*b* which in turn causes conduction through pillars 14 of current to electrodes 28. These electrodes 28 are joined together and connected to the output Q of the of the NAND gate 50 to implement the logic of the first three rows of the truth table 52, that is, providing a high voltage at Q when one or both of inputs A and B are low.

The electrode 20 of electromechanical transistor 10*c* is connected to input A and electrode 20 of electromechanical transistor 10*d* is connected to input B. The remaining electrodes 22 of these electromechanical transistors 10*c* and 10*d* are connected to ground. Electrode 28 of electromechanical transistor 10*d* is then connected to the Q output and has its electrode 26 connected to electrode 28 of electromechanical transistor 10*c* whose electrode 26 is connected to ground. Thus, electromechanical transistors 10*c* and 10*d* are in series and when both are activated when A and B have a logical true state, (a state reflected in the last row of the truth table 52), output Q will be connected to ground and therefore will be pulled to a logical low state.

It will be understood that from a NAND gate 50 a number of devices can be produced including flip-flop, adders, inverters, and multiplexers according to methods well known in the art for use with standard NAND gates. These elements provide sufficient components for the construction of a wide variety of logical devices currently constructed of bipolar transistors using the same construction techniques, including field programmable gate arrays, microcontrollers, microprocessors and other specialized logic circuits. These logic circuits may be combined with analog circuits such as mixers, choppers, modulators, and filters and the like, using a similar architecture.

The above-described NAND gate 50 provides a building block sufficient to produce a complete digital computer using, for example, a computer memory constructed of flip-flop circuits. Nevertheless, the number of pillars 12 and 14 necessary to implement such a device will be large and accordingly a more efficient memory element may be desired.

Figure 8:
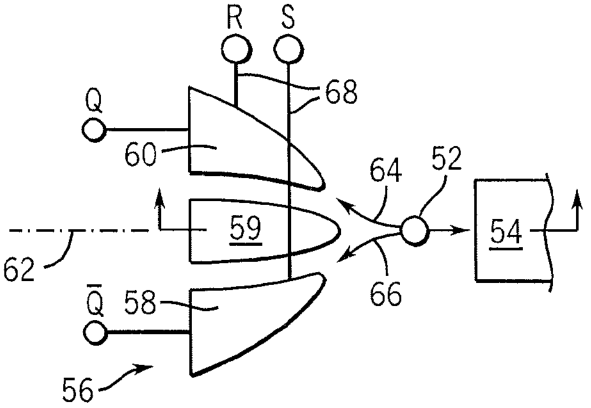
FIG. 8 is a top plan view of a memory element for use with circuits constructed using the present invention.
Figure 9:
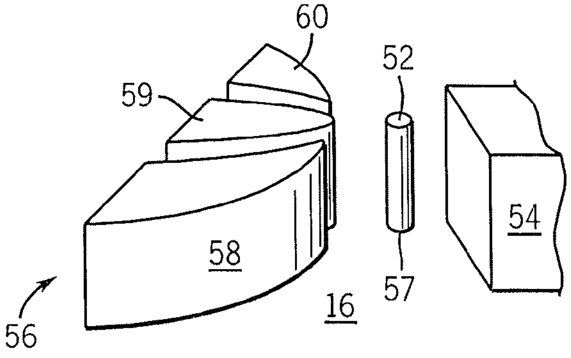
FIG. 9 is a perspective view of the memory element of FIG. 8.

Referring now to FIGS. 8 and 9, a more efficient memory structure may employ a single pillar 53 placed between an electrode unit 54 and electrode unit 56 to vibrate therebetween in a manner similar to that described above. Electrode unit 54 may present a generally planar face while electrode unit 56 may present two independent electrodes 58 and 60 presenting sharpened ends facing the pillar 53 opposite electrode unit 54. The two independent electrodes 58 and 60 are separated along axis 62, passing between the electrode unit 54 and electrode unit 56.

Aligned with that axis 62 and between independent electrodes 58 and 60 may be a bias electrode 59 creating an electrostatic field (together with applied potentials to independent electrodes 58 and 60 and electrode unit 54) promoting two stable alternative resonant modes of vibration for pillar 53. One mode 64 may curve toward electrode 60 and one mode 66 may curve toward electrode 58. Depending on the mode adopted by the pillar 53, charge will be shuttled between electrode unit 54 and electrode 60 providing a Q output, or charge will be shuttled from electrode unit 54 to electrode 58 providing a not-Q output. The memory state may therefore be expressed according to the resonant mode 64 and 66 as may be determined by the path of current flow out of electrode 60 or 58. Modal changes (implementing a change in the mode from 64 to 66 or vice versa) may be effected by temporarily changing the voltage on one of the electrodes 58 and 60 through a set or reset input 68.

Referring to FIG. 9, the insulating portion of pillar 53 may be concentrated in a thin insulation layer 57 separating a conductive substrate 16 from a remaining conductive portion of pillar 53. Brief application of a high voltage to the substrate can reversibly pass current through the thin insulation layer 57 into the pillar 53 charging the pillar 53 to provide faster self excitation when the device is first activated. A similar technique can be used for pillars 12 described above.

When an AC excitation signal is used to induce motion of pillar 12 rather than self-excitation, a single self exciting transistor of the type described in the above cited U.S. Pat. No. 6,946,693 may be placed in series with the electrodes 20 and 22 for each electromechanical transistor 10 allowing DC voltages to be used to communicate logic signals and for control electrodes to be driven by power electrodes.

While the present architecture of upstanding pillars from a substrate 16 provides considerable fabrication advantages, it will be understood that this invention could employ pillars that are coplanar with the substrate and cantilevered over the substrate in a manner of presently designed accelerometers and the like.

It will be further understood from the foregoing description that the switching "transistor" created by the present invention can be used in a variety of circuit elements beyond those described herein. For example the invention is not limited to NAND gates but may be used to construct AND gates, OR gates, NOR gates, inverters (NOT gates) and other logical elements well known in the art and currently constructed from conventional transistors. Further the invention is not limited to logical gates, but may find used for other switching applications including multiplexers, crossbar switches, switched capacitor circuits including filters, analog shift registers, and the like.

It is specifically intended that the present invention not be limited to the embodiments and illustrations contained herein, but include modified forms of those embodiments including portions of the embodiments and combinations of elements of different embodiments as come within the scope of the following claims.

We claim:

1. An electrical switching element comprising:

at least one first nanoscale pillar extending upward from a substrate between first opposed electrodes to flex between the first electrodes; and at least one second nanoscale pillar extending upward from the substrate between second opposed electrodes, the second nanoscale pillar coupled to the first nanoscale pillar to flex with the first nanoscale pillar alternately toward and away from alternate second electrodes influenced by flexure of the first nanoscale pillar;

whereby flexure of the first nanoscale pillar promotes a charge transfer between the second opposed electrodes via the second nanoscale pillar.

2. The electrical switching element of claim 1 wherein greater charge transfer occurs between the second opposed electrodes than between the first opposed electrodes for each cycle of flexure of the pillars.

3. The electrical switching element of claim 1 wherein the first pair of opposed electrodes and the second pair of opposed electrodes have substantially identical bias voltages.

4. The electrical switching element of claim 1 wherein the first nanoscale pillar is coupled to the second nanoscale pillar with a web attached to the first nanoscale pillar and second nanoscale pillar to communicate the flexure of the first nanoscale pillar to the second nanoscale pillar.

5. The electrical switching element of claim 4 wherein the web is flexible to allow substantial motion of the first nanoscale pillar independent of the second nanoscale pillar.

6. The electrical switching element of claim 1 wherein the first nanoscale pillar and multiple second nanoscale pillars are arranged along a common web mechanically connecting each of the pillars and flexing therewith.

7. The electrical switching element of claim 1 wherein there is only a single first nanoscale pillar.

8. The electrical switching element of claim 1 wherein the first nanoscale pillar self-excites into oscillation between the first opposed electrodes with an application of a DC voltage across the first opposed electrodes.

9. A logical NAND gate formed of multiple electric switching elements of claim 1 wherein the first electrodes of the electrical switching elements provide control electrodes and the second electrodes of the electrical switching elements provide power of electrodes;

wherein a first and second input to the logical NAND gate connect respectively to control electrodes of a first and second electric switching elements having power electrodes connected in parallel between a power source and an output of the NAND gate; and wherein the first and second input to the logical NAND gate connect respectively to control electrodes of a third and fourth electric switching elements having power electrodes connected in series between a power return and an output of the NAND gate.

10. A computer comprising a plurality of electric switching elements of claim 1 interconnected to provide logical gates and further including at least one memory element communicating with the logical gates to provide for execution of a stored program.

11. The computer of claim 10 wherein the memory element is comprised of logical gates connected as bi-stable elements.

12. The computer of claim 10 wherein the memory element is comprised of a pillar extending upward from a substrate between opposed first and second electrode units providing an electric field therebetween;

wherein the second electrode unit presents a bifurcated electrode face of electrically independent electrodes;

wherein electrode faces of the first and second electrode units are shaped to promote two distinct vibratory modes of flexure of the pillar within the electric field: a first mode of flexure transferring charge between the first electrode unit and a first electrode of the second electrode unit and a second mode of flexure transferring charge between the first electrode unit and a second electrode of the second electrode unit; and wherein storage of information is held by the vibratory mode.

* * * * *